United States Patent
Brunner et al.

(10) Patent No.: US 7,965,031 B2
(45) Date of Patent: Jun. 21, 2011

(54) WHITE-EMITTING LED HAVING A DEFINED COLOR TEMPERATURE

(75) Inventors: Herbert Brunner, Sinzing (DE); Tim Fiedler, München (DE); Frank Jermann, München (DE); Jörg Strauβ, Regensburg (DE); Martin Zachau, Geltendorf (DE)

(73) Assignees: OSRAM Gesellschaft mit beschränkter Haftung, München (DE); Osram Opto Semiconductors GmbH, Regensburg (DE)

( * ) Notice: Subject to any disclaimer, the term of this patent is extended or adjusted under 35 U.S.C. 154(b) by 420 days.

(21) Appl. No.: 10/574,026

(22) PCT Filed: Sep. 24, 2004

(86) PCT No.: PCT/DE2004/002138
§ 371 (c)(1),
(2), (4) Date: Mar. 23, 2006

(87) PCT Pub. No.: WO2005/031797
PCT Pub. Date: Apr. 7, 2005

(65) Prior Publication Data
US 2006/0289878 A1    Dec. 28, 2006

(30) Foreign Application Priority Data
Sep. 24, 2003 (DE) .................. 103 44 331

(51) Int. Cl.
*H01J 1/62* (2006.01)
*H01J 63/04* (2006.01)

(52) U.S. Cl. .. 313/503; 313/498; 313/512; 252/301.4 R; 252/301.6 R

(58) Field of Classification Search .......... 313/483–487, 313/498–512; 252/301.4 F, 301.4 R, 301.6 R
See application file for complete search history.

(56) References Cited

U.S. PATENT DOCUMENTS

| | | | |
|---|---|---|---|
| 4,897,319 A | 1/1990 | Sun et al. | |
| 6,158,882 A * | 12/2000 | Bischoff, Jr. .................. | 362/488 |
| 6,255,670 B1 | 7/2001 | Srivastava et al. | |
| 6,539,656 B2 | 4/2003 | Maas et al. | |

(Continued)

FOREIGN PATENT DOCUMENTS

DE    19806536    4/2001

(Continued)

OTHER PUBLICATIONS

J.W.H. van Krevel, "On new rare-earth doped M-Si—Al—O—N materials—Luminescence properties and oxidation resistance", Chapter 6, Luminescence of Ln-Si—O—N:Tb (Ln=Y, Gd, La), pp. 73-87 2000, ISBN 90-386-2711-4.

(Continued)

*Primary Examiner* — Nimeshkumar D Patel
*Assistant Examiner* — Thomas A Hollweg
(74) *Attorney, Agent, or Firm* — Cohen Pontani Lieberman & Pavane LLP

(57) ABSTRACT

LED with a low color temperature up to 3500 K, comprising a blue-emitting LED with two phosphors in front of it, a first phosphor from the class of the oxynitridosilicates, having a cation M, which is doped with divalent Europium, and has the empirical formula $M_{(1-c)}Si_2O_2N_2:D_c$, with M=Sr, or M=$Sr_{(1-x-y)}Ba_yCa_x$ with x+y<0.5 being used, the oxynitridosilicate completely or predominantly comprising the high-temperature-stable modification HT, and a second phosphor from the class of the nitridosilicates of formula $(Ca,Sr)_2Si_5N_8:Eu$.

20 Claims, 5 Drawing Sheets

U.S. PATENT DOCUMENTS

| | | |
|---|---|---|
| 6,632,379 B2 | 10/2003 | Mitomo et al. |
| 6,649,946 B2 | 11/2003 | Bogner et al. |
| 6,670,748 B2 | 12/2003 | Ellens et al. |
| 6,692,136 B2 | 2/2004 | Marshal et al. |
| 6,717,353 B1 * | 4/2004 | Mueller et al. ............. 313/501 |
| 7,061,024 B2 * | 6/2006 | Schmidt et al. ............. 257/98 |
| 7,351,356 B2 | 4/2008 | Delsing et al. |
| 2002/0003233 A1 | 1/2002 | Mueller-Mach et al. |
| 2002/0043926 A1 | 4/2002 | Takahashi et al. |
| 2002/0105269 A1 * | 8/2002 | Ellens et al. ............. 313/512 |
| 2003/0094893 A1 * | 5/2003 | Ellens et al. ............. 313/503 |
| 2003/0168643 A1 | 9/2003 | Mitomo et al. |
| 2004/0124758 A1 | 7/2004 | Danielson et al. |
| 2004/0135504 A1 * | 7/2004 | Tamaki et al. ............. 313/512 |
| 2004/0155225 A1 | 8/2004 | Yamada et al. |
| 2005/0042743 A1 | 2/2005 | Kawai et al. |
| 2005/0156496 A1 | 7/2005 | Takashima et al. |
| 2005/0205845 A1 * | 9/2005 | Delsing et al. ......... 252/301.4 R |
| 2005/0253500 A1 | 11/2005 | Gotoh et al. |
| 2006/0011922 A1 | 1/2006 | Schmidt et al. |
| 2006/0244000 A1 | 11/2006 | Jager et al. |
| 2007/0018567 A1 | 1/2007 | Hirosaki |
| 2007/0040152 A1 | 2/2007 | Oshio |
| 2007/0080326 A1 | 4/2007 | Fiedler et al. |
| 2007/0248519 A1 | 10/2007 | Mitomo et al. |

FOREIGN PATENT DOCUMENTS

| | | |
|---|---|---|
| DE | 100 24 924 | 11/2001 |
| DE | 101 53 615 C1 | 7/2003 |
| DE | 102 03 795 A1 | 8/2003 |
| EP | 0584599 | 8/1993 |
| EP | 1150361 | 4/2001 |
| EP | 1104799 | 6/2001 |
| EP | 1 413 618 A1 | 9/2002 |
| EP | 1264873 | 12/2002 |
| EP | 1 296 376 A | 3/2003 |
| EP | 1411558 | 4/2004 |
| EP | 1413618 | 4/2004 |
| JP | 2004-134805 | 4/2004 |
| WO | WO 97/48138 | 12/1997 |
| WO | WO 00/19141 | 4/2000 |
| WO | WO 01/24229 A2 | 4/2001 |
| WO | WO 01/40403 A | 6/2001 |
| WO | WO 01/40403 A1 | 6/2001 |
| WO | WO 01/41215 A1 | 6/2001 |
| WO | WO 01/50540 A1 | 7/2001 |
| WO | WO 01/89001 | 11/2001 |
| WO | WO 02/052901 A2 | 7/2002 |
| WO | WO 02/052902 A2 | 7/2002 |
| WO | WO2004/030109 | 4/2004 |
| WO | WO 2004/036962 | 4/2004 |

OTHER PUBLICATIONS

Office Action dated Jul. 11, 2008 issued for the counterpart Chinese Patent Application No. 200480034723.8 (9 pages).

Krevel, et al., "Luminescence Properties of Terbium-, Cerium, or Europium-Doped Alpha-Sialon Materials", Journal of Solid State Chemistry, Orlando, Fl, vol. 165, No. 1, pp. 19-24, Apr. 2002.

Xie et al, "Preparation and Luminescence Spectra of Calcium- and Rare-Earth (R=Eu, TB, and PR)-Codonped Alaph-Sion Ceramics", Journal of the American Ceramic Society, American Cermaic Society, Columbus, US, vol. 85, No. 5,pp. 1229-1234, Oct. 2000.

J. van Krevel, "On new rare-earth doped M-Si—Al—O—N materials", Chapter 6, pp. 73-87, 2000.

Office Action dated Apr. 3, 2009 for related U.S. Appl. No. 10/574,021.

Office Action dated May 26, 2009 for related U.S. Appl. No. 10/574,021.

Interview Summary dated May 20, 2009 for related U.S. Appl. No. 10/574,021.

Notice of Allowance dated Mar. 9, 2010 for related U.S. Appl. No. 10/574,021.

Office Action dated Jul. 29, 2008 for related U.S. Appl. No. 10/572,891.

Office Action dated Mar. 20, 2009 for related U.S. Appl. No. 10/572,891.

Office Action dated Nov. 12, 2009 for related U.S. Appl. No. 10/572,891.

Office Action dated Apr. 29, 2010 for related U.S. Appl. No. 10/572,891.

Notice of Allowance dated Aug. 5, 2010 for related U.S. Appl. No. 10/572,891.

* cited by examiner

WHITE-EMITTING LED HAVING A DEFINED COLOR TEMPERATURE

RELATED APPLICATIONS

This is a U.S. national stage of application No. PCT/DE2004/002136, filed on 24 Sep. 2004.

The present application is closely related to the following applications: 10/573,398, 10/572,891 and 10/574,021.

FIELD OF THE INVENTION

The invention is based on an LED with a defined, in particular low, color temperature. This is to be understood as meaning a color temperature in the range from 2300 to 7000 K.

BACKGROUND OF THE INVENTION

The range of warm-white color temperatures, i.e. below 3500 K, has hitherto been difficult to realize using commercially available LEDs. The standard phosphors produce a color temperature of more than 5000 K. Therefore, it has hitherto been attempted to produce warm-white color temperatures in a very complex way by combining a plurality of LEDs cf., for example, WO 02/52901 and WO 02/52902.

Simple LEDs, aimed at producing warm-white luminous colors have hitherto been based on UV chips. On account of the considerable energy difference between the UV region and the short-wave visible region (blue), and also on account of the UV-induced, which is higher on account of the higher energy, radiation-induced more rapid aging of the housing and of the phosphor potting, these LEDs fail to achieve either the service life or the efficiency of neutral-white LEDs based on blue-emitting chips as have hitherto been available.

One alternative is RGB-LEDs based on luminescence conversion LEDs comprising sulfide and thiogallate phosphors, cf., for example WO 01/24229. However, it has been found that the phosphor proposed in that document does not satisfy the requirements with regard to long-term stability and efficiency when using high-power chips which reach a high operating temperature. The sulfides are chemically unstable with respect to moisture and the thiogallates proposed have a pronounced temperature quenching. Moreover, on contact with water, the known sulfide phosphors decompose to form toxic gases, such as hydrogen sulfide.

An alternative solution which can be demonstrated to have a long service life and a high efficiency combined with a very good color rendering index has not hitherto been disclosed. The use of a mixture of the known YAG:Ce and a red phosphor, such as for example Sr2Si5N8:Eu only leads to maximum Ra values of 85 to 90, cf. in this respect, WO 01/40403.

Phosphors of the oxynitridosilicate type are known per se under the shortened formula MSiON; cf. for example, "On new rare-earth doped M—Si—Al—O—N materials", J. van Krevel, T U Eindhoven 2000, ISBN 90-386-2711-4, Chapter 6. They are doped with Tb. Emission is achieved under excitation by 365 nm or 254 nm.

A new type of phosphor is known from the as yet unpublished EP patent application 02 021 117.8. It consists of Eu- or Eu,Mn-coactivated oxynitridosilicate of formula $MSi_2O_2N_2$ (M=Ca, Sr, Ba).

SUMMARY OF THE INVENTION

It is an object of the present invention to provide a white-emitting LED with a defined color temperature, with an Ra that is as high as possible, reaching at least Ra=80, in particular higher than Ra=85, preferably higher than 90.

Hitherto, there has been no satisfactory way of realizing this objective. It is now proposed to use a phosphor mixture comprising a special, highly efficient green-emitting Sr Sion phase and a red nitride phosphor that is known per se.

This and other objects are attained in accordance with one aspect of the present invention directed to an LED which is designed as a white-emitting luminescence conversion LED, comprising a primary radiation source, which is a chip that emits in the blue spectral region, with in front of it a layer of two phosphors, both of which partially convert the radiation of the chip, wherein the first phosphor is from the class of the oxynitridosilicates having a cation M and the empirical formula $M_{(1-c)}Si_2O_2N_2:D_c$, where M comprises Sr as the main constituent and D is doped with divalent Europium, M=Sr or $M=Sr_{(1-x-y)}Ba_yCa_x$ with 0 x+y<0.5 being used, the oxynitridosilicate completely or predominantly comprising the high-temperature-stable modification HT, and in that the second phosphor is a nitridosilicate of formula $(Ca,Sr)_2Si_5N_8:Eu$, producing a color temperature of from 2300 to 7000 K.

An embodiment of the invention uses a phosphor which represents an oxynitridosilicate of formula $MSi_2O_2N_2$ (M=Ca, Sr, Ba) which is activated with divalent Eu, if appropriate with the further addition of Mn as co-activator, with the HT phase forming the majority or all of the phosphor, i.e. more than 50% of the phosphor. This HT modification is distinguished by the fact that it can be excited within a broad band, namely in a wide range from 200 to 480 nm, that it is extremely stable with respect to external influences, i.e. does not reveal any measurable degradation at 150° C., and that it has an extremely good color locus stability under fluctuating conditions (little drift detectable between 20 and 100° C.). This phosphor is often also referred to below as Sr Sion: Eu.

This phosphor is primarily green-emitting, with a dominant wavelength in the range from 550 to 570 nm.

When producing the novel phosphor, it is particularly important to use a high temperature range, the synthesis range lying between 1300 and 1600° C. Another determining factor is the reactivity of the starting components, which should be as high as possible.

In particular, this phosphor can be excited efficiently by an LED, in particular of the InGaN type.

The phosphor $MSi_2O_2N_2$:Eu (M=Ca, Sr, Ba) which is known from EP patent application 02 021 117.8, in the case of the Sr-dominated embodiment with $M=Sr_{(1-x-y)}Ba_yCa_x$ with $0 \leq x+y<0.5$, referred to below as Sr Sion, is difficult to control. Although some test conditions give excellent results, there has hitherto been no guiding principle as to how to obtain desired results in a reliable way. An additional factor is a certain tendency of the efficiency of the phosphor to be reduced and the color locus to vary excessively under high thermal loads.

The following are particularly preferred: y=0 with $0 \leq x \leq 0.3$ and X=0 with $0 \leq y \leq 0.1$.

Surprisingly, it has now been found that the two phases fundamentally differ in terms of their suitability for use as a phosphor. Whereas the LT phase is of only limited use as an Eu-doped phosphor and only emits weak orange-red light, the HT phase has an excellent suitability for use as a phosphor which emits green light. There is normally a mixture of the two modifications which manifests both forms of emission over a broad band. It is therefore crucial for the HT phase to be produced in as pure a form as possible, in a proportion of at least 50%, preferably at least 70%, particularly preferably at least 85%.

This requires an annealing process which is carried out at at least 1300° C. but no more than 1600° C. A temperature range from approximately 1450 to 1580° C. is preferred, since LT phase is formed to an increasing extent at lower temperatures and the phosphor becomes increasingly difficult to process at higher temperatures; above approximately 1600° C. it forms a hard-sintered ceramic or melt. The optimum temperature range depends on the precise composition and the properties of the starting materials.

A batch of the starting products which is substantially stoichiometric using the base components $SiO_2$, $SrCO_3$ and $Si_3N_4$ is particularly important for producing an efficient phosphor of the Sr Sion type. Sr acts as a representative example of M in this context. The deviation should amount to no more than in particular 10%, preferably 5%, from the ideal stoichiometric batch, including any addition of a melting auxiliary, as is often customary. A maximum deviation of 1% is particularly preferred. In addition, there is a precursor for the europium fraction of the doping, realized, for example, as oxide $Eu_2O_3$. This discovery runs contrary to the previous procedure of adding the base component $SiO_2$ in a significantly substoichiometric proportion. This discovery is also particularly surprising on account of the fact that other Sions which are recommended for use as phosphors, such as Ba Sion in accordance with the teaching of EP patent application 02 021 117.8, should indeed be produced with a substoichiometric quantity of $SiO_2$.

Therefore, a corresponding batch for the Sr Sion $MSi_2O_2N_2$ uses 11 to 13% by weight of $SiO_2$, 27 to 29% by weight of $Si_3N_4$, remainder $SrCO_3$. Ba and Ca fractions in M are correspondingly added as carbonates. Europium is added, in accordance with the desired doping, for example as an oxide or fluoride, as a replacement for $SrCO_3$. The batch $MSi_2O_2N_2$ is also to be understood as encompassing any deviations from the exact stoichiometry, provided that they are compensated for with a view to charge retention.

It has proven particularly expedient for the starting components of the host lattice, in particular $Si_3N_4$, to have the highest possible purity. Therefore, $Si_3N_4$ which is synthesized from the liquid phase, for example starting from silicon tetrachloride, is particularly preferred. In particular the contamination with tungsten and cobalt has proven critical. The impurity levels of each of these constituents should be as low as possible, and in particular should in each case be less than 100 ppm, in particular less than 50 ppm, based on these precursor substances. Furthermore, the highest possible reactivity is advantageous; this parameter can be quantified by the reactive surface area (BET), which should be at least 6 $m^2/g$, advantageously at least 8 $m^2/g$. The level of contamination with aluminum and calcium, based on this precursor substance $Si_3N_4$, should as far as possible also be below 100 ppm.

In the event of a deviation from the above procedure with regard to a stoichiometric batch and temperature management, increasing levels of undesirable foreign phases, namely nitridosilicates $M_xSi_yN_z$, such as for example $M_2Si_5N_8$, are formed if the addition of $SiO_2$ is set at too low a level, so that an excess of nitrogen is produced. Although this compound per se is a useful phosphor, with regard to the synthesis of the Sr Sion, it is extremely disruptive just like other nitridosilicates, since these foreign phases absorb the green radiation of the Sr Sion and may convert it into the known red radiation provided by the nitridosilicates. Conversely, if too much $SiO_2$ is added, Sr silicates, such as for example $Sr_2SiO_4$, are formed, since an excess of oxygen is produced. Both foreign phases absorb the useful green emission or at least lead to lattice defects such as vacancies, which have a considerable adverse effect on the efficiency of the phosphor. The starting point used is the basic principle that the level of the foreign phases should be as far as possible below 15%, preferably even below 5%. In the XRD spectrum of the synthesized phosphor, this corresponds to the requirement that with the XRD diffraction angle $2\Theta$ in the range from 25 to 32°, the intensity of all the foreign phase peaks should be less than ⅓, preferably less than ¼, particularly preferably less than ⅕, of the intensity of the main peak characterizing the HT modification at approximately 31.8°. This applies in particular to the foreign phases of type $Sr_xSi_yN_z$, in particular $Sr_2Si_5N_8$.

With an optimized procedure, it is reliably possible to achieve a quantum efficiency of from 80 to well over 90%. By contrast, if the procedure is not specific, the efficiency will typically lie in the range from at most 50 to 60% quantum efficiency.

It is therefore possible to produce a phosphor which represents an oxynitridosilicate of formula $MSi_2O_2N_2$ (M=Ca, Sr, Ba) which is activated with divalent Eu, if appropriate with the further addition of Mn as co-activator, with the HT phase forming the majority or all of the phosphor, i.e. more than 50% of the phosphor. This HT modification is distinguished by the fact that it can be excited within a broad band, namely in a wide range from 250 to 480 nm, that it is extremely stable with respect to external influences, i.e. does not reveal any measurable degradation at 150° C. in air, and that it has an extremely good color locus stability under fluctuating conditions. Further plus points include its low absorption in the red, which is particularly advantageous in the case of phosphor mixtures. This phosphor is often also referred to below as Sr Sion:Eu. A majority of the HT modification can be recognized, inter alia, from the fact that the characterizing peak of the LT modification in the XRD spectrum at approximately 28.2° has an intensity of less than 1:1, preferably less than 1:2, compared to the peak with the highest intensity from the group of three reflections of the HT modification which lie in the XRD spectrum at 25 to 27°. The XRD spectra cited here in each case relate to excitation by the known Cu—$K_\alpha$ line.

With the same activator concentration, this phosphor reveals different emission characteristics than the LT variant of the same stoichiometry. The full width at half maximum of the HT variant is significantly lower in the case of the optimized HT variant than in the case of the simple mixture containing foreign phases and defects, and is in the range from 70 to 80 nm, whereas the simple mixture containing foreign phases and defects has a full width at half maximum of approximately 110 to 120 nm. The dominant wavelength is generally shorter, typically 10 to 20 nm shorter, in the case of the HT modification than in the case of a specimen containing significant levels of foreign phases. An additional factor is that the efficiency of the high-purity HT modification is typically at least 20% higher, and in some cases significantly higher still, than in the case of the LT-dominated mixture or the mixture with a high level of foreign phases.

One feature of a sufficiently low level of the LT modification and foreign phases is a full width at half maximum (FWHM) of the emission of less than 90 nm, since the lower the level of foreign phases, the lower the proportion of the specific orange-red emission from the modification which is rich in foreign phases, in particular the nitridosilicate foreign phases Sr—Si—N—Eu such as in particular $Sr_2Si_5N_8$:Eu.

The abovementioned typical reflections in the XRD spectrum, which reveal the different crystal structure, are another important factor, in addition to the reduced full width at half maximum.

The dominant peak in the XRD spectrum of the HT modification is the peak at approximately 31.7°. Other prominent peaks are the three peaks of approximately the same intensity between 25 and 27° (25.3 and 26.0 and 26.3°), with the peak with the lowest diffraction being the most intensive. A further intensive peak is 12.6°.

This phosphor emits predominantly green light with a dominant wavelength in the range from 550 to 570 nm, in particular 555 to 565 nm.

It is also possible to add a small amount of the AlO group as a replacement for the SiN group in the molecule of the oxynitridosilicate of formula $MSi_2O_2N_2$, in particular in an amount of up to at most 30% of the SiN content.

Both phases of the Sr Sion:Eu can crystallize analogously to the two structurally different host lattice modifications and can each be produced using the SrSi2O2N2:Eu batch stoichiometry. Minor deviations from this stoichiometry are possible. The Eu-doped host lattices surprisingly both luminesce when excited in the blue or UV region, but in each case after host lattice modification with a different emission color. The LT modification reveals an orange emission, the HT modification a green emission at approximately $\lambda_{dom}$=560 nm with in principle a significantly higher efficiency. A desired property of the phosphor can be set accurately as a function of the dopant content and dopant material (Eu or Eu, Mn) and the relative proportions of the HT and LT modifications.

One benefit of the HT phase is the fact that it can be excited with a good level of uniformity over a very wide spectral region with only minor variations in the quantum efficiency.

Moreover, within a wide temperature range the luminescence of the HT modification is only weakly dependent on the temperature. Therefore, the invention has for the first time discovered a green-emitting phosphor, preferably for LED applications, which makes do without special measures to stabilize it. This distinguishes it in particular from the phosphors which have previously been regarded as the most promising candidates for this purpose, namely thiogallate phosphors or chlorosilicates.

The Sion compounds with M=(Sr,Ba), preferably without Ba or with up to 10% of Ba, represent efficient phosphors with a wide range of emission maxima. These maxima are generally at a shorter wavelength than in the case of pure Sr Sion, preferably between 520 and 565 nm. Moreover, the color space which can be achieved can be widened by adding small amounts (preferably up to 30 mol %) of Ca and/or zinc; this shifts the emission maxima toward the longer-wave region compared to pure Sr Sion, and by partially (up to 25 mol %) replacing Si with Ge and/or Sn.

A further embodiment is for M, in particular Sr, to be partially substituted by trivalent or monovalent ions, such as La3+ or Li+ or Na+ or Y3+. It is preferable for these ions to form at most 20 mol % of the M.

Surprisingly, the Sr Sion of the HT phase has now provided a phosphor which can be set exactly to a green peak emission, for example of wavelength 560 nm (dominant wavelength). The phosphor converts the light from a blue or UV LED with a quantum efficiency of well over 80%. The lumen-based efficiency is comparable to that of typical white LEDs based on YAG:Ce.

A further advantage is that the emission color of the luminescence conversion LED is virtually independent of the operating temperature, which means that the LED can be operated successfully at different outside temperatures and can be dimmed with a stable color locus.

The second phosphor component is the nitride of type (Sr,Ca)2Si5N8:Eu mentioned in the introduction in a suitable composition. These two phosphors, the typical quantum efficiencies of which are well over 80% and both of which absorb very successfully in the region of short-wave blue radiation, in particular also at 450 to 465 nm, where the strongest chips are available, make it possible to provide efficient warm-white LEDs with a color rendering index Ra of up to 95. Depending on the desired optimization, a typical Ra value is from 85 to 95.

The particular advantage of this very combination is that the two phosphors have similar temperature properties with regard to the efficiency of luminescence, with the result that it is advantageously possible to produce dimmable LEDs with a color locus that is as constant as possible.

The luminescence is much less temperature-dependent than in the case of the sulfide phosphors that have been proposed hitherto, and moreover both types of phosphors are significantly more chemically stable than their sulfide alternatives that have been disclosed hitherto (SrS:Eu and thiogallates). The two nitride-based phosphors and their possible decomposition products are substantially non-toxic, which also plays a role with regard to the environment.

Standard processes can be used for use in the LED. In particular, the following implementation options result.

Firstly, dispersing the phosphor in the LED potting, for example a silicone or epoxy resin, followed by application by, for example, potting, printing, spraying or the like. Secondly, introducing the phosphor into what is known as a molding compound, followed by transfer molding. Thirdly, near-chip conversion methods, i.e. applying the phosphors or the mixture thereof to the wafer processing level after dicing of the chips and after mounting in the LED housing. In this context, reference is made in particular to DE 101 53 615 and WO 01/50540.

The invention also relates to an illumination system having LEDs as described above, the illumination system also including electronic components which, for example, impart dimmability. A further role of the electronics is to drive individual LEDs or groups of LEDs. These functions can be realized by known electronic elements.

DETAILED DESCRIPTION OF THE DRAWINGS

Figure 1:
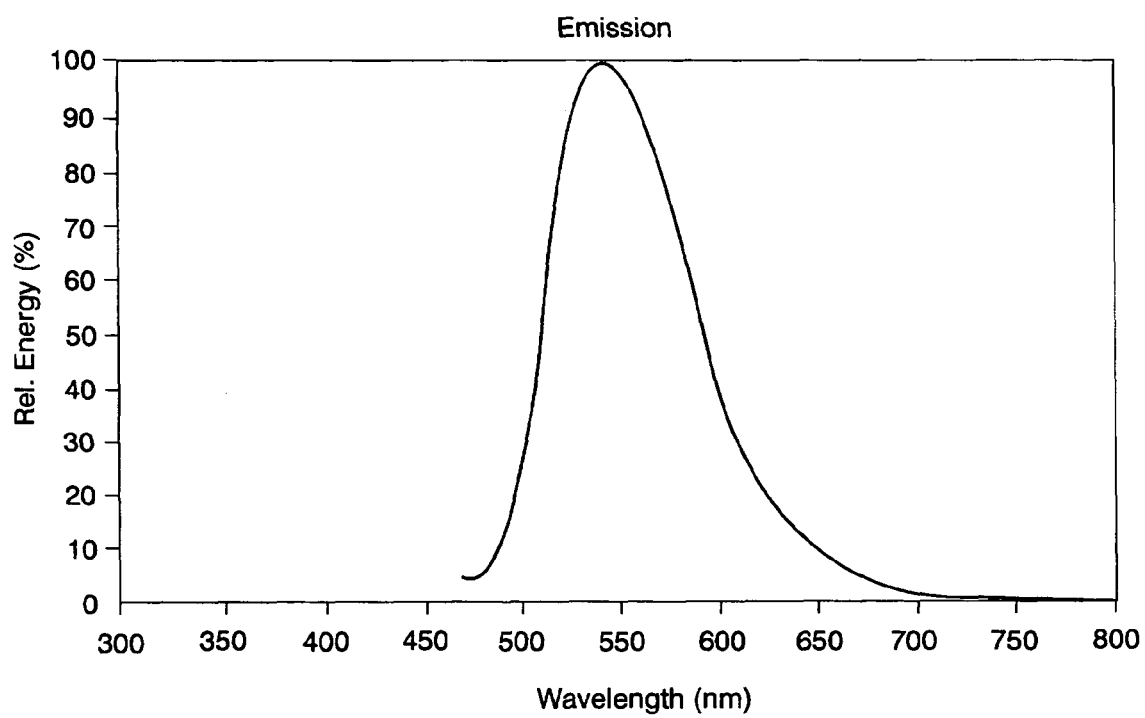
FIG. 1 shows an emission spectrum for an oxynitridosilicate.

FIG. 1 shows a specific example for the phosphor according to the invention. This example relates to the emission of the phosphor $SrSi_2N_2O_2$:(5% $Eu^{2+}$) in the HT modification, in which the Eu fraction forms 5 mol % of the lattice sites occupied by Sr. The emission maximum is at 540 nm, the mean wavelength λdom at 558 nm. The color locus is x=0.357; y=0.605. The excitation took place at 460 nm, and FWHM is 76 nm. The quantum efficiency is approximately 90%. The color locus is x=0.357, y=0.605.

Figure 2:
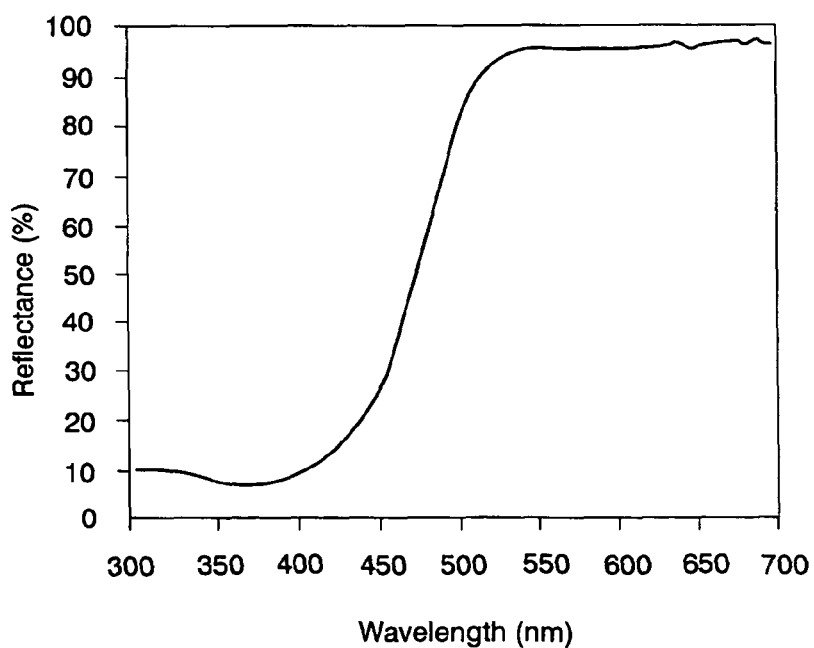
FIG. 2 shows the reflection spectrum for this oxynitridosilicate.

FIG. 2 shows the diffuse reflection spectrum for this phosphor. It reveals a pronounced minimum in the range below 440 nm, which therefore demonstrates the good excitability in this range.

Figure 3:
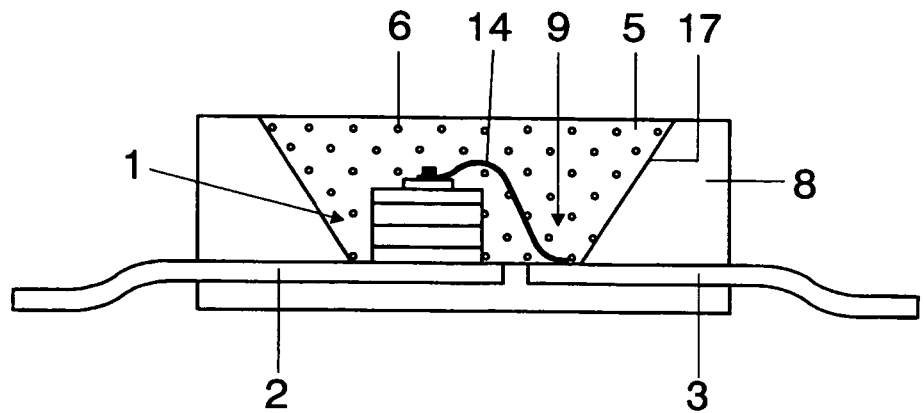
FIG. 3 shows a semiconductor component which serves as light source for warm-white light.
Figure 4:
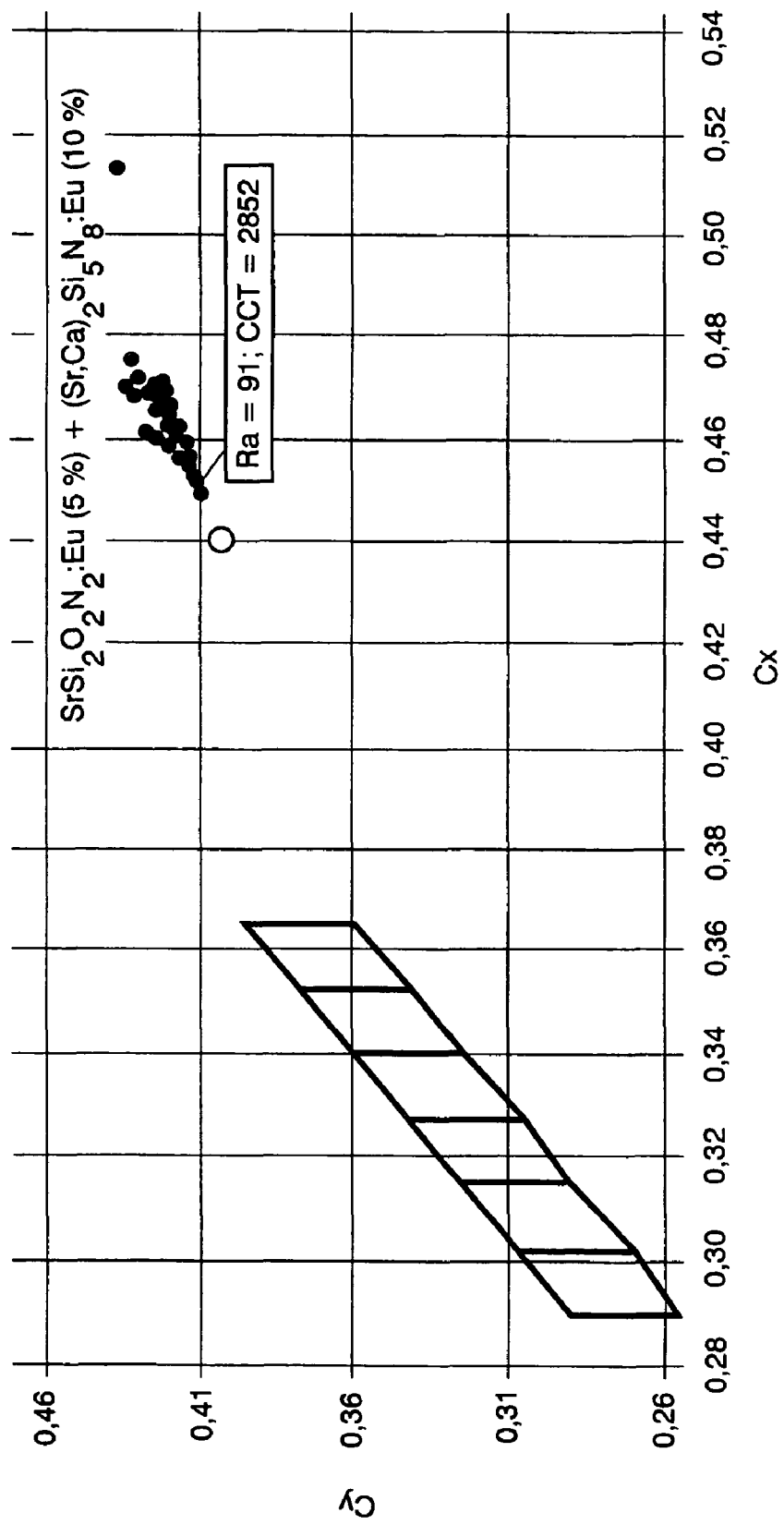
FIG. 4 shows the position of the color locus for various batches of a warm-white LED.

FIG. 3 specifically illustrates the structure of a light source for white light. The light source is a semiconductor component having a chip 1 of the InGaN type with a peak emission wavelength of from 440 to 470 nm, for example 460 nm, which is embedded in an opaque basic housing 8 in the region of a recess 9. The chip 1 is connected to a first terminal 3 via a bonding wire 14 and to a second electrical terminal 2 directly. The recess 9 is filled with a potting compound 5, which as its main constituents contains an epoxy casting resin (80 to 90% by weight) and phosphor pigments 6 from a mixture of two phosphors (less than 20% by weight). A first phosphor is the oxynitridosilicate containing 5% of Eu proposed as the first exemplary embodiment, and the second phosphor is a red-emitting phosphor, in this case in particular $(Sr,Ca)_2Si_5N_8$:Eu(10%). The recess 9 has a wall 17 which serves as reflector for the primary and secondary radiation from the chip 1 and the pigments 6, respectively. The combination of the blue primary radiation and green and red secondary radiation mixes to form warm white with a high Ra of 91 and a color temperature of 2850 K. The desired color locus is in the range from x=0.44 to 0.48 and y=0.40 to 0.44, cf. FIG. 4. The ratio of Sr to Ca in the nitridosilicate is in this case 9:1.

Figure 5:
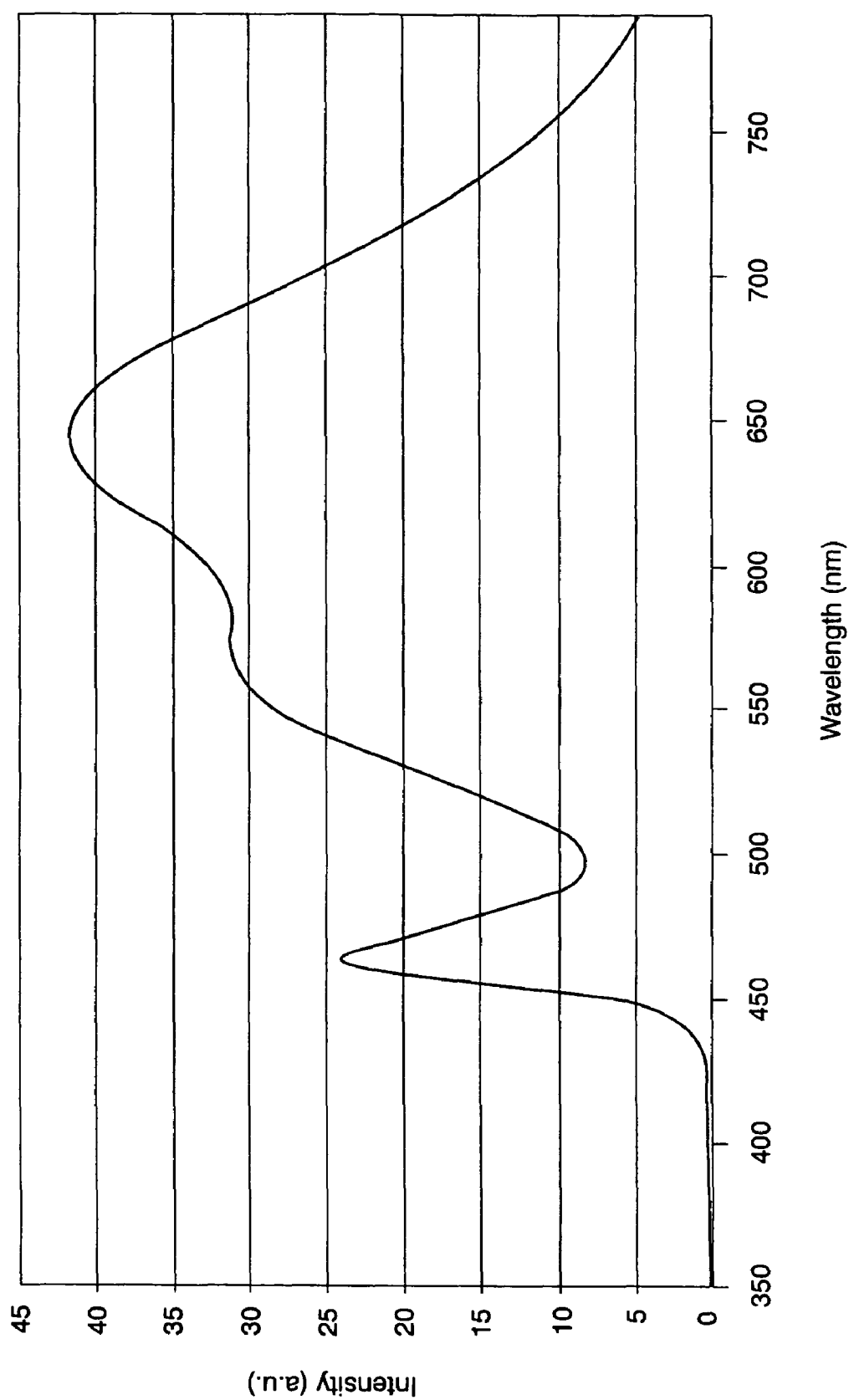
FIG. 5 shows an emission spectrum of a light source in accordance with FIG. 3.

FIG. 5 shows the associated emission spectrum. It shows the intensity in arbitrary units as a function of the wavelength (in nm). The peaks of the primary radiation of 460 nm, of the oxynitridosilicate at approximately 560 nm and of the nitridosilicate at approximately 640 nm are clearly apparent.

The nitridosilicate $M_aSi_yN_z$:Eu generally contains Sr as a permanent component and Ca as an admixture in a proportion of from 0 to 60 mol %. in particular, the preferred nitridosilicate is characterized by the formula $(Sr_{1-x}Ca_x)_2Si_yN_z$ with x=0 to 0.6, in which y=5 and z=8 and generally y,z≦10 being selected here. In general, the efficiency and the color rendering index Ra are optimized by the extent of doping with Eu; it is preferable for Eu to be from 5 to 10 mol % of the M. The addition of Ca in particular makes it possible to avoid having to add excessively high levels of the dopant Eu. It has been found that to achieve high color rendering indices, it is recommended to add Ca and to limit the Eu content. Therefore, for Ra>90, x can be selected up to at most 0.2 (preferably x up to 0.1), and at the same time Eu can preferably be added in the range from 3 to 15 mol % of M (preferably 5 to 10 mol %). Good results with a high Ra can also be achieved for 0.2<x<0.55 if Eu is simultaneously set to 1 to 5 mol % of M.

Figure 6:
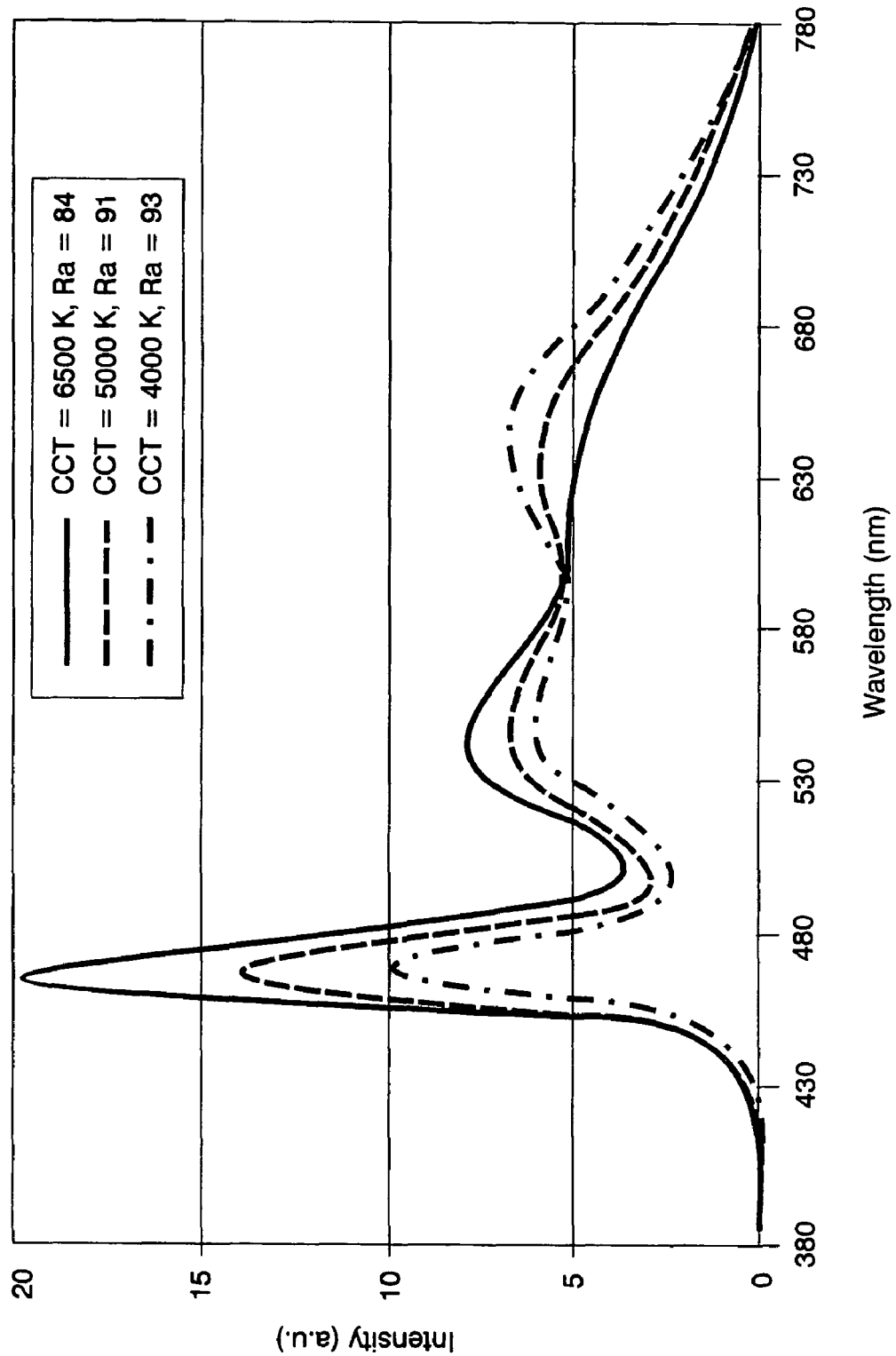
FIG. 6 shows further emission spectra for light sources in accordance with FIG. 3.

FIG. 6 shows LEDs with a higher color temperature. To achieve color temperatures of higher than approximately 3300 K, the total phosphor concentration has to be reduced compared to the first exemplary embodiment, resulting in a higher transmitted blue LED component and an increased level of the green phosphor (oxynitridosilicate) in relation to the red phosphor (nitridosilicate). An LED with a peak wavelength of 460 nm was used as primary light source and blue emitter. The specific phosphors used in this case are Sr—SiON:Eu(5%) as oxynitridosilicate and SrCaSiN:Eu (3%) as nitridosilicate.

The Ra value drops if a shorter-wave LED is used. For example, it has been found that if a primary LED with a peak wavelength of 450 nm is used, the Ra drops to below 80 at a color temperature of 6500 K.

Figure 7:
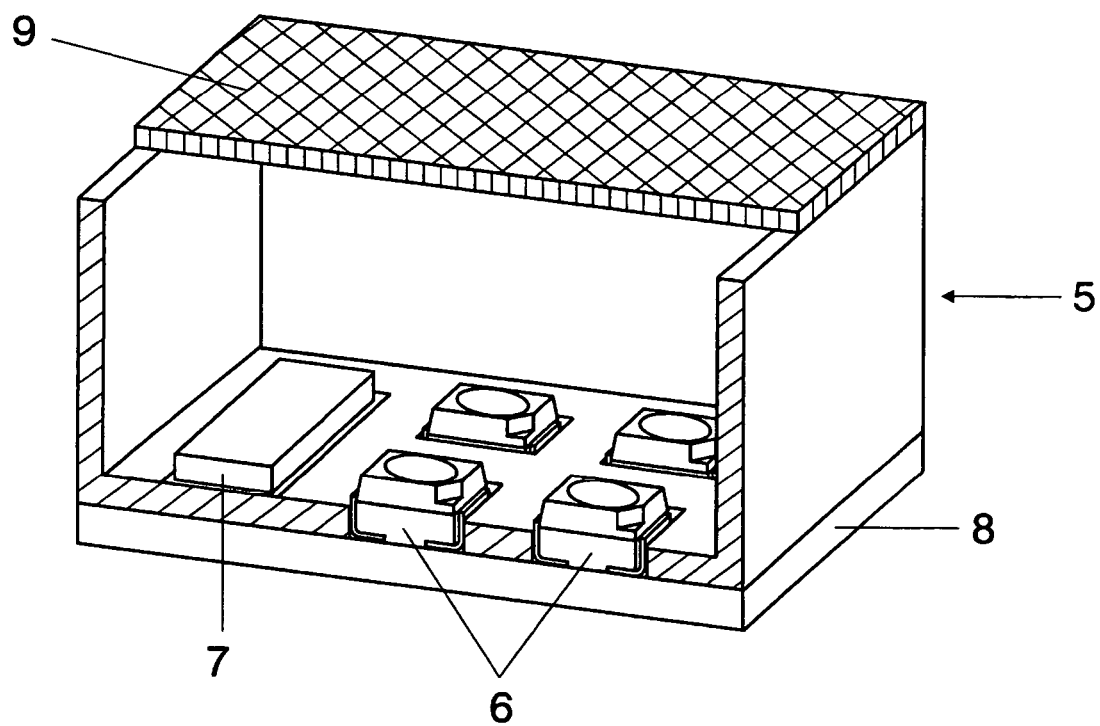
FIG. 7 shows an illumination system based on warm-white LEDs.

FIG. 7 shows an illumination system 5 in which, in addition to warm-white emitting LEDs 6, control electronics 7 are also accommodated in a housing 8. A cover is denoted by 9.

The invention claimed is:

1. A white-emitting LED with a defined color temperature, designed as a luminescence conversion LED, comprising:
   a primary radiation source, which is a chip that emits in the blue spectral region;
   a layer of first and second phosphors in front of said source, both of which phosphors partially convert the radiation of the chip;
   wherein the first phosphor is from the class of the oxynitridosilicates having a cation M and the empirical formula $M_{(1-c)}Si_2O_2N_2$:$D_c$, where M comprises Sr as the main constituent and D is doped with divalent Europium, M=Sr or M=$Sr_{(1-x-y)}Ba_yCa_x$ with 0≦x+y<0.5 being used, the oxynitridosilicate completely or predominantly comprising a high-temperature-stable modification HT, the oxynitridosilicate comprising less than 100 ppm tungsten impurity and less than 100 ppm cobalt impurity; and
   wherein the second phosphor is a nitridosilicate of formula $(Ca,Sr)_2Si_5N_8$:Eu, producing a color temperature of from 2300 to 7000 K and at the same time achieving a color rendering of Ra>90.

2. The LED as claimed in claim 1, wherein in the oxynitridosilicate the Eu fraction makes up between 0.1 and 20 mol % of M.

3. The LED as claimed in claim 1, wherein a proportion of M is replaced by Ba and/or Ca and/or Zn.

4. The LED as claimed in claim 3, wherein the proportion of M replaced by Ba and/or Ca and/or Zn is up to 30 mol %.

5. The LED as claimed in claim 1, wherein the LED is dimmable.

6. The LED as claimed in claim 1, wherein the LED has a color temperature of from 2700 to 3300 K.

7. The LED as claimed in claim 1, wherein the LED achieves the white luminous color by color mixing with the RGB principle, with the primary emission of the blue LED having a peak wavelength of from 430 to 470 nm.

8. The LED as claimed in claim 7, wherein the emission from the chip has a peak wavelength in the range from 450 to 465 nm.

9. The LED as claimed in claim 1, wherein the nitridosilicate contains Sr as a permanent component, and Ca in a proportion of from 0 to 60 mol %.

10. The LED as claimed in claim 1, wherein the emission of the nitridosilicate has a dominant wavelength $\lambda_{dom}$, in the range from 620 to 660 nm.

11. An illumination system having the LED as claimed in claim 1, wherein the system includes electronics for driving the individual LEDs or groups of LEDs.

12. The illumination system as claimed in claim 11, wherein the electronic control includes means which impart dimmability.

13. A white-emitting LED with a defined color temperature, designed as a luminescence conversion LED, comprising:
   a primary radiation source, which is a chip that emits in the blue spectral region;
   a layer of first and second phosphors in front of said source, both of which phosphors partially convert the radiation of the chip;
   wherein the first phosphor is from the class of the oxynitridosilicates having a cation M and the empirical formula $M_{(1-c)}Si_2O_2N_2$:$D_c$, where M comprises Sr as the main constituent and D is doped with divalent Europium, M=Sr or M=$Sr_{(1-x-y)}Ba_yCa_x$ with 0≦x+y<0.5 being used, the oxynitridosilicate completely or predominantly comprising a high-temperature-stable modification HT, the oxynitridosilicate comprising less than 100 ppm tungsten impurity and less than 100 ppm cobalt impurity;

wherein the second phosphor is a nitridosilicate of formula $(Ca,Sr)_2Si_5N_8$:Eu, producing a color temperature of from 2300 to 7000 K and at the same time achieving a color rendering of at least Ra=80; and wherein a proportion of M is replaced by Li and/or La and/or Na and/or Y.

14. The LED as claimed in claim 13, wherein the proportion of M replaced by Li and/or La and/or Na and/or Y is up to 30 mol %.

15. A white-emitting LED with a defined color temperature, designed as a luminescence conversion LED, comprising:

a primary radiation source, which is a chip that emits in the blue spectral region;

a layer of first and second phosphors in front of said source, both of which phosphors partially convert the radiation of the chip;

wherein the first phosphor is from the class of the oxynitridosilicates having a cation M and the empirical formula $M_{(1-c)}Si_2O_2N_2:D_c$, where M comprises Sr as the main constituent and D is doped with divalent Europium, M=Sr or M=$Sr_{(1-x-y)}Ba_yCa_x$ with $0 \leq x+y<0.5$ being used, the oxynitridosilicate completely or predominantly comprising a high-temperature-stable modification;

the second phosphor is a nitridosilicate of formula $(Ca,Sr)_2Si_5N_8$:Eu, producing a color temperature of from 2300 to 7000 K and at the same time achieving a color rendering of at least Ra=80; and a proportion of the Si atoms in the empirical formula for said first phosphor are replaced by Al atoms, a proportion of the N atoms in the empirical formula for said first phosphor is replaced by O atoms, and the proportion of the Si atoms that are replaced by Al atoms and the proportion of N atoms that are replaced by O atoms are in the same molar amount.

16. The LED as claimed in claim 15, wherein the proportion of the Si atoms that are replaced by the Al atoms and the portion of the N atoms that are replaced by the O atoms are both up to 30 mol %.

17. A white-emitting LED with a defined color temperature, designed as a luminescence conversion LED, comprising:

a primary radiation source, which is a chip that emits in the blue spectral region;

a layer of first and second phosphors in front of said source, both of which phosphors partially convert the radiation of the chip;

wherein the first phosphor is from the class of the oxynitridosilicates having a cation M and the empirical formula $M_{(1-c)}Si_2O_2N_2:D_c$, where M comprises Sr as the main constituent and D is doped with divalent Europium, M=Sr or M=$Sr_{(1-x-y)}Ba_yCa_x$ with $0 \leq x+y<0.5$ being used, the oxynitridosilicate completely or predominantly comprising a high-temperature-stable modification HT, the oxynitridosilicate comprising less than 100 ppm tungsten impurity and less than 100 ppm cobalt impurity;

the second phosphor is a nitridosilicate of formula $(Ca,Sr)_2Si_5N_8$:Eu, producing a color temperature of from 2300 to 7000 K and at the same time achieving a color rendering of at least Ra=80; and a proportion of Europium in the first phosphor is replaced by Mn.

18. The LED as claimed in claim 17, wherein the proportion of Europium replaced by Mn is up to 30 mol %.

19. A white-emitting LED with a defined color temperature, designed as a luminescence conversion LED, comprising:

a primary radiation source, which is a chip that emits in the blue spectral region;

a layer of first and second phosphors in front of said source, both of which phosphors partially convert the radiation of the chip;

wherein the first phosphor is from the class of the oxynitridosilicates having a cation M and the empirical formula $M_{(1-c)}Si_2O_2N_2:D_c$, where M comprises Sr as the main constituent and D is doped with divalent Europium, M=Sr or M=$Sr_{(1-x-y)}Ba_yCa_x$ with $0 \leq x+y<0.5$ being used, the oxynitridosilicate completely or predominantly comprising a high-temperature-stable modification HT, the oxynitridosilicate comprising less than 100 ppm tungsten impurity and less than 100 ppm cobalt impurity; and the second phosphor is a nitridosilicate of formula $(Ca,Sr)_2Si_5N_8$:Eu, producing a color temperature of from 2300 to 7000 K and at the same time achieving a color rendering of at least Ra=80; and the chip is an InGaN chip.

20. A white-emitting LED with a defined color temperature, designed as a luminescence conversion LED, comprising:

a primary radiation source, which is a chip that emits in the blue spectral region;

a layer of first and second phosphors in front of said source, both of which phosphors partially convert the radiation of the chip;

wherein the first phosphor is from the class of the oxynitridosilicates having a cation M and the empirical formula $M_{(1-c)}Si_2O_2N_2:D_c$, where M comprises Sr as the main constituent and D is doped with divalent Europium, M=Sr or M=$Sr_{(1-x-y)}Ba_yCa_x$ with $0 \leq x+y<0.5$ being used, the oxynitridosilicate completely or predominantly comprising a high-temperature-stable modification HT, the oxynitridosilicate comprising less than 100 ppm tungsten impurity and less than 100 ppm cobalt impurity;

the second phosphor is a nitridosilicate of formula $(Ca,Sr)_2Si_5N_8$:Eu, producing a color temperature of from 2300 to 7000 K and at the same time achieving a color rendering of at least Ra=80; and the emission of the oxynitridosilicate has a dominant wavelength $\lambda_{dom}$ in the range from 550 to 570 nm.

* * * * *